(12) United States Patent
Kwak et al.

(10) Patent No.: US 8,043,892 B2
(45) Date of Patent: Oct. 25, 2011

(54) SEMICONDUCTOR DIE PACKAGE AND INTEGRATED CIRCUIT PACKAGE AND FABRICATING METHOD THEREOF

(75) Inventors: Kyu-Sub Kwak, Suwon-si (KR); Jae-Hyuck Lee, Anyang-si (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 536 days.

(21) Appl. No.: 12/099,354

(22) Filed: Apr. 8, 2008

(65) Prior Publication Data

US 2008/0272469 A1    Nov. 6, 2008

(30) Foreign Application Priority Data

May 2, 2007    (KR) .................. 10-2007-0042610

(51) Int. Cl.
*H01L 23/552*    (2006.01)

(52) U.S. Cl. ............... 438/107; 257/659; 257/E23.114; 257/E21.505

(58) Field of Classification Search .......... 257/659, 257/E23.114, E21.505
See application file for complete search history.

(56) References Cited

U.S. PATENT DOCUMENTS

2005/0067676 A1 * 3/2005 Mahadevan et al. .......... 257/659
2006/0145361 A1    7/2006 Yang et al.

FOREIGN PATENT DOCUMENTS

KR    2006-98431    9/2006
* cited by examiner

*Primary Examiner* — Benjamin Sandvik
*Assistant Examiner* — Krista Soderholm
(74) *Attorney, Agent, or Firm* — Cha & Reiter, LLC

(57) ABSTRACT

A semiconductor die package includes a substrate, a semiconductor die mounted on the substrates a molding covering the semiconductor die and which is formed on the substrate and a conductive layer laminated on the molding.

8 Claims, 7 Drawing Sheets

US 8,043,892 B2

SEMICONDUCTOR DIE PACKAGE AND INTEGRATED CIRCUIT PACKAGE AND FABRICATING METHOD THEREOF

CLAIM OF PRIORITY

This application claims the benefit of the earlier filing date, pursuant to 35 USC 119, to that patent application entitled "Semiconductor Die Package And Integrated Circuit Package And Fabricating Method Thereof," filed with the Korean Intellectual Property Office on May 2, 2007 and assigned Serial No. 2007-42610, the contents of which are incorporated herein by reference.

BACKGROUND OF THE INVENTION

1. Field of the Invention

The present invention relates to a integrated circuit package, and more particularly to electromagnetic shielding of semiconductor die package and integrated circuit packages, and a fabricating method thereof.

2. Description of the Related Art

A highly integrated circuit by semiconductor technologies is utilized as a semiconductor die package or an integrated circuit package in which a semiconductor die package is mounted. Also, the above described packages are the basis for realizing micro-sized and high performance electronic devices with small volume. That is, the above described semiconductor die package and integrated circuit package have been widely used for developing portable devices, e.g., mobile terminals, telephones, iPods, iPhones. iPod and iPhone are registered trademarks of Apple Inc, Cupertino, Calif., USA.

The above described semiconductor die package includes a substrate, and a semiconductor die surface-mounted on the substrate. The above described integrated circuit package includes a printed circuit board, and the semiconductor die package and multiple electronic components which are surface-mounted on the printed circuit board.

The above described integrated circuit package and semiconductor die package require a means of suppressing EMI leakage and preventing outside electromagnetic interference from causes errors. As the electromagnetic shielding means, an electromagnetic shielding molding and a metal can surrounding the molding are typically used. An integrated circuit package in which multiple semiconductor die packages are integrated may cause mutual interference due to different frequency bandwidths of respective semiconductor die packages.

The above described molding may include electromagnetic shielding material, and the metal can is partially soldered to the substrate or the printed circuit board, thereby forming electrical grounding and a physical combination.

However, since a metal can is attached to a substrate or a printed circuit board through soldering, conductive material may be electrically short-circuited with peripheral electrical wirings while soldering.

In order to prevent electrical short-circuit caused by soldering of a metal can, a metal can and circuit patterns on a printed circuit board or on a substrate require a space therebetween. Accordingly, there is a problem in that the entire volume of the laser package is increased.

SUMMARY OF THE INVENTION

The present invention provides an electromagnetic shielding means which can be applied to a semiconductor die package or an integrated circuit package without increasing the volume of the packaging significantly.

In accordance with an aspect of the present invention, there is provided a semiconductor die package including a substrate, a semiconductor die mounted on the substrate, a molding, covering the semiconductor die and formed on the substrate and a conductive layer laminated on the molding.

In accordance with another aspect of the present invention, there is provided an integrated circuit package including a printed circuit board provided with at least one ground terminal, at least one electrical terminal, and at least one electronic component electrically connected to the ground/electrical terminal a semiconductor die package mounted on the printed circuit board, a molding formed on the printed circuit board covering the semiconductor die package and the electronic component, and a conductive layer applied and laminated on the molding.

BRIEF DESCRIPTION OF THE DRAWINGS

The above and other exemplary features, aspects, and advantages of the present invention will be apparent from the following detailed description taken in conjunction with the accompanying drawings, in which.

DETAILED DESCRIPTION OF THE INVENTION

Exemplary embodiments of the present invention will be described in detail with reference to the accompanying drawings. For the purposes of clarity and simplicity, a detailed description of known functions and configurations incorporated herein is omitted to avoid obscuring the subject matter of the present invention.

Figure 1:
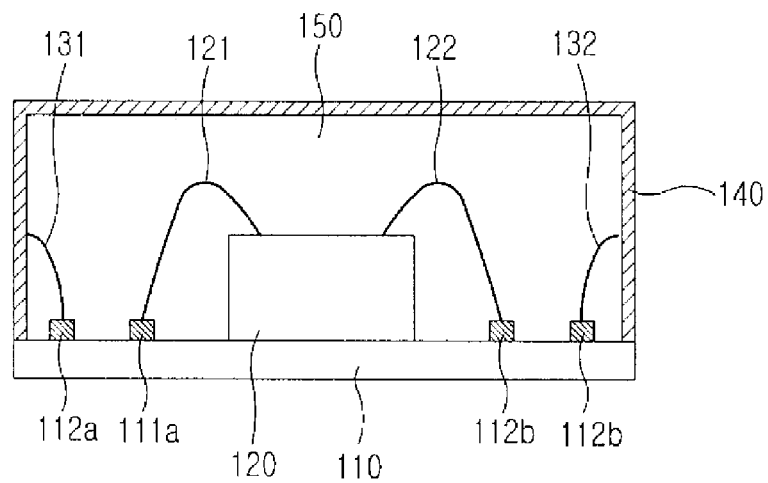
FIG. 1 is a cross-sectional view showing a semiconductor die package according to a first embodiment of the present invention.

FIG. 1 is a cross-sectional view showing a semiconductor die package according to a first embodiment of the present invention. A semiconductor die package 100 according to the present embodiment includes a substrate 110 on which circuit patterns, including ground terminals and/or electrical terminals 111a, 111b, 112a, and 112b, are formed, a semiconductor die 120 surface-mounted on the substrate 110, a molding 150, a conductive layer 140 laminated on the molding 150, and electrical wirings 121, 122, 131, and 132.

The semiconductor die 120 is attached to the substrate 110, and is electrically connected to the electrical terminals 111a and 111b. Electrical wirings 121 and 122 electrically connect the electrical terminals 111a and 111b with the semiconductor die 120, and electrical wirings 131 and 132 electrically connect the ground terminals 112a and 112b with the conductive layer 140. Wire-bonding may be used for the electrical wirings 121, 122, 131 and 132.

The molding 150 is formed on the substrate 110 in such a manner that wirings connected to the ground terminals 112a and 112b are exposed on one surface or one side surface of the molding 150, and buries the semiconductor die 120, the electrical wirings 121, 122, 131, and 132, and the electrical and ground terminals 111a, 111b, 112a, and 112b. The molding 150 may include electromagnetic shielding material, in which polycarbonate or polymer is mixed with metal particles such as copper (Cu).

The conductive layer 140 is formed on the outer surface of the molding 150 through plating or coating, and thus is electrically connected to the electrical wirings 131 and 132 exposed on both side surfaces of the molding 150. Accordingly, the conductive layer 140 can ground EMI coming into/out of the semiconductor die package 100 through the ground terminals 112a and 112b.

In the semiconductor die package 100 according to the present embodiment, multiple ground terminals 112a and 112b are formed on the substrate 110, and the electrical wirings 131 and 132 connecting between the adjacent ground terminals 112a and 112b are cut by sawing, or etching through molding 150, thereby exposing the electrical wirings 131 and 132 on the outer surface of the molding 150.

Also, the present invention may be applied to a structure where the ground terminals 112a and 112b are cut together with the molding 150, thereby exposing the side surfaces of the ground terminals 112a and 112b on the outer surface of the molding 150.

Figure 2:
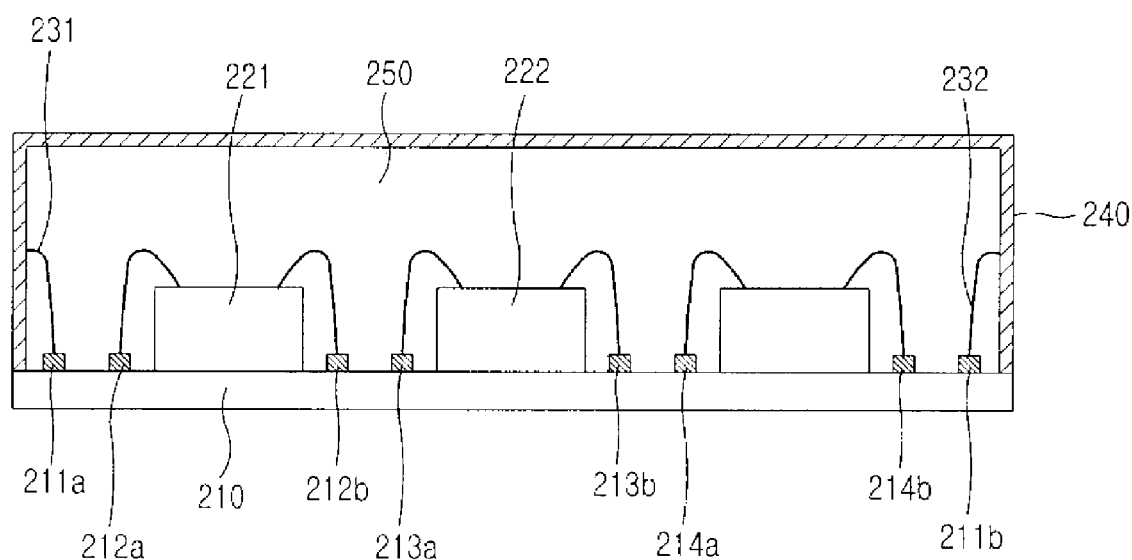
FIG. 2 is a cross-sectional view showing an integrated circuit package according to a second embodiment of the present invention.

FIG. 2 is a cross-sectional view showing an integrated circuit package according to a second embodiment of the present invention. An integrated circuit package according to the present embodiment includes a printed circuit board 210 on which ground and electrical terminals 211a, 211b, 212a, 212b, 213a, 213b, 214a and 214b are formed, a semiconductor die package 222 and electronic components 221 and 223, which are surface-mounted on the printed circuit board 210, a molding 250, a conductive layer 240, and electrical wirings 231 and 232.

The printed circuit board 210 is provided with circuit patterns including at least one or more ground terminals 211a and 211b and electrical terminals 212a, 212b, 213a, 213b, 214a and 214b on the upper surface, and is mounted with the electronic components 221 and 223 and the semiconductor die package 222.

The semiconductor die package 222 may be constructed in the same manner as the first embodiment of the present invention, and may be attached on the printed circuit board 210 by a surface mounting technology. In the surface mounting technology, electronic components and semiconductor die packages are soldered to a printed circuit board, and herein the components may be disposed on both surfaces of the printed circuit board.

The molding 250 is formed on the printed circuit board 210 so as to cover the semiconductor die package 222 and the electronic components 221 and 223, and, on the outer surface of the molding 250, the electrical wirings 231 and 232 connected to the ground terminals 211a and 211b are exposed.

The conductive layer 240 is laminated on the outer surface of the molding 250, and is electrically connected to the electrical wirings 231 and 232 exposed on the outer surface of the molding 250. Herein, the conductive layer 240 includes conductive material, which may be made of plated metal, and can ground EMI coming into the conductive layer 240, through the ground terminal 211 connected via the electrical wirings 231 and 232.

FIGS. 3A to 3E represent cross-sectional views showing respective steps in a method for fabricating a semiconductor die package shown in FIG. 1. A method for fabricating a semiconductor die package 300 according to a first embodiment of the present invention includes the steps of forming circuit patterns including ground and/or electrical terminals 311 and 312, respectively, on a substrate 310, mounting multiple semiconductor dies 320 on the substrate 310, electrically connecting selected ground terminals 311 by electrical wirings 313, forming a molding 330 covering the circuit patterns, the ground 311, electrical 312 terminals and the semiconductor dies 320 on the substrate 310, cutting the electrical wirings 313 connecting the ground terminals 311, together with the molding 330 and laminating a conductive layer 340 on the outer surface of the molding 330.

Figure 3A:
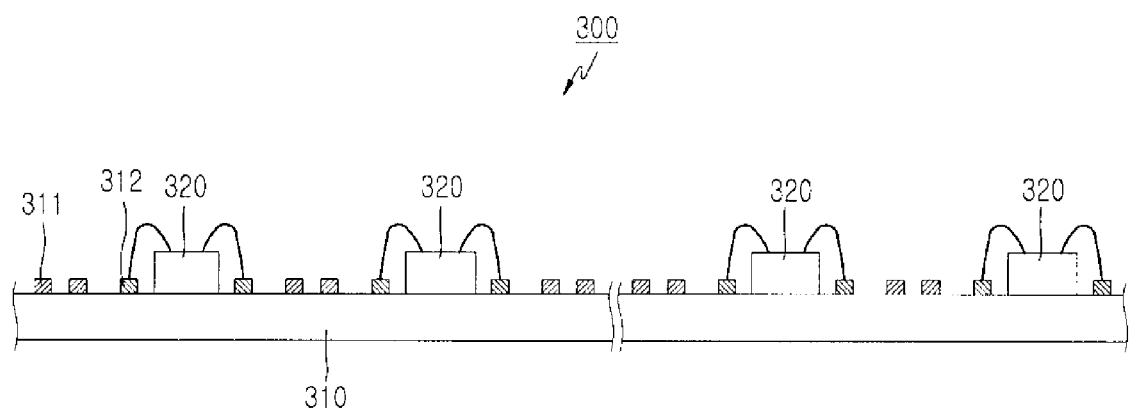
FIGS. 3A to 3E are cross-sectional views showing respective steps in a method for fabricating a semiconductor die package shown in FIG. 1.

FIG. 3A is a cross-sectional view showing the substrate 310 on which the circuit patterns including the ground and electrical terminals 311, 312, respectively, are formed. Also, multiple circuit patterns and multiple semiconductor dies 320 are mounted on the substrate 310 so as to form multiple semiconductor die packages 300. Herein, each semiconductor die 320 is connected to associated electrical terminals 312 of the circuit patterns by electrical wirings 314, such as wire-bonding.

Figure 3B:
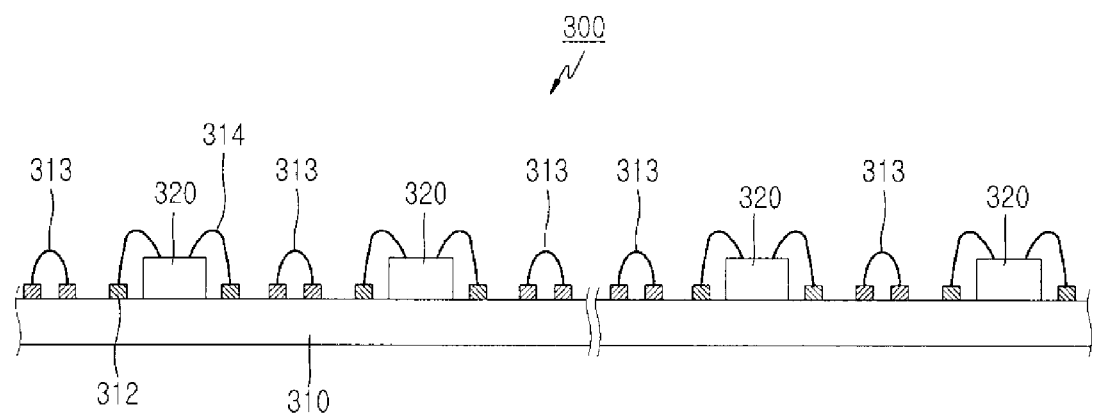

FIG. 3B is a cross-sectional view showing adjacent ground terminals 311 electrically connected by the electrical wirings 313. The electrical wirings 313 electrically connect the adjacent ground terminals 311 by wire-bonding.

Figure 3C:
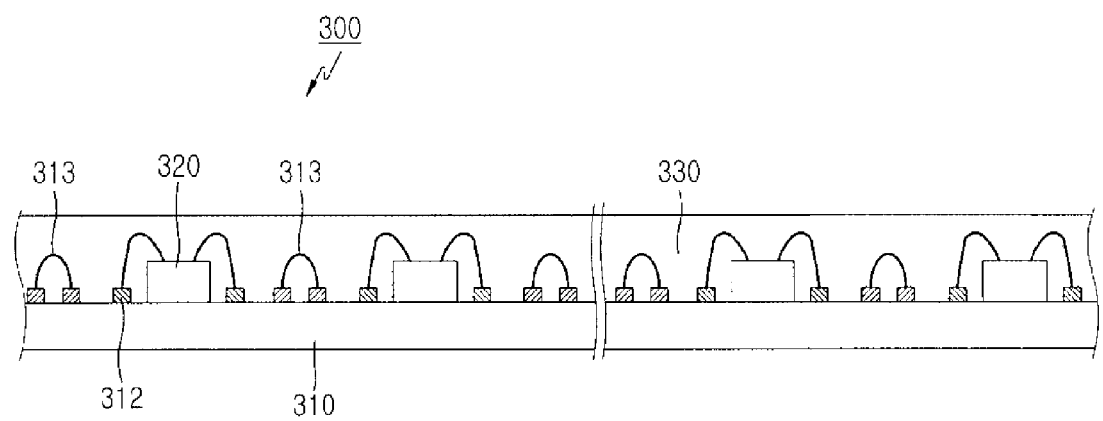

FIG. 3C is a cross-sectional view showing the substrate 310 on which the molding 330 covering the ground and electrical terminals 311, 312, respectively, and the semiconductor dies 320 is formed.

Figure 3D:
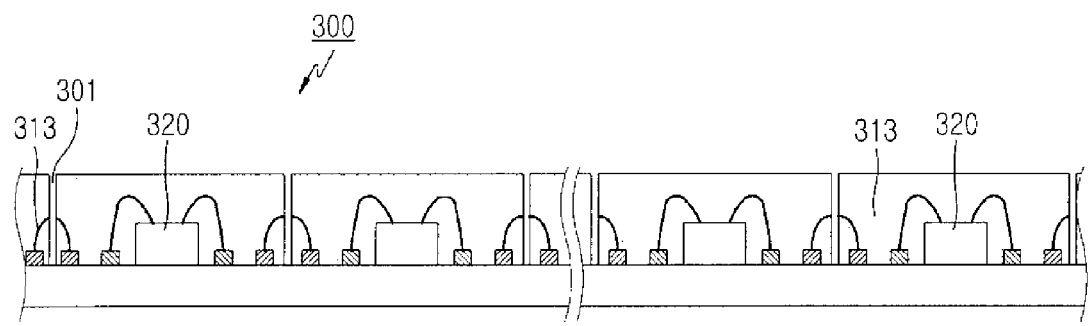

FIG. 3D is a cross-sectional view of the electrical wirings 313 connecting adjacent ones of the ground terminals 311 and molding 330 being separated by cutting portions of the molding between the packages, and accordingly, the electrical wirings 313 connecting adjacent ground terminals 311.

In other words, the electrical wirings connecting between the adjacent ground terminals are cut together with the molding. The cut electrical wirings are thus exposed on the side surfaces of the molding.

Figure 3E:
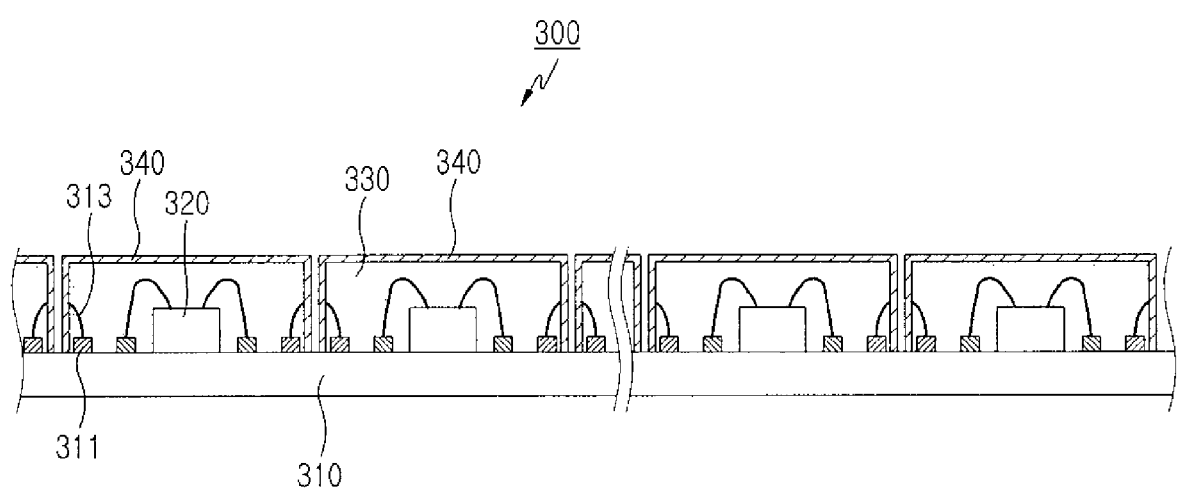

FIG. 3E is a cross-sectional view showing a conductive layer 340 laminated on the outer surface of the molding. The conductive layer may be laminated in a manner that the conductive layer is electrically connected to the electrical wirings 313 exposed on the outer surface of the molding. Herein, the conductive layer, may be a conductive material, such as a metal, and can be laminated on the outer surface of the molding through plating.

In the semiconductor die packages shown in FIG. 3D, a protective film (not shown) may be attached to the lower surface of the substrate 310 in order to prevent the lower surface of the substrate 310 from being exposed to the outside environment. Then, as shown in FIG. 3E, the conductive layer 340 may be laminated through plating, or other similar process on the substrate 310. After the formation of the conductive layer 340, the protective film may be removed.

The semiconductor die packages 300 shown in FIG. 3E may be cut by sawing through the substrate 310 and be separated to have the a form similar to the semiconductor die package as shown in FIG. 1.

The present embodiment can be also applied to a method for fabricating an integrated circuit package in which multiple electronic components and semiconductor die packages are integrated on a printed circuit board. Besides the process of integrating electronic components and semiconductor die packages on a printed circuit board, other processes of the present embodiment are applied to the above described method.

FIGS. 4A to 4E represent cross-sectional views showing respective fabricating steps of a semiconductor die package or an integrated circuit package according to another embodiment of the present invention. A method for fabricating semiconductor die packages 400 according to this embodiment of the present invention includes the steps of forming circuit patterns including ground and electrical terminals 411, 412, respectively, on a substrate 410, mounting multiple semiconductor dies 420 on the substrate 410, forming a molding 430 covering the circuit patterns and the semiconductor dies 420 on the substrate 410, cutting the ground terminals 411 and the molding 430 and laminating a conductive layer 440 on the outer surface of the molding 430.

Figure 4A:
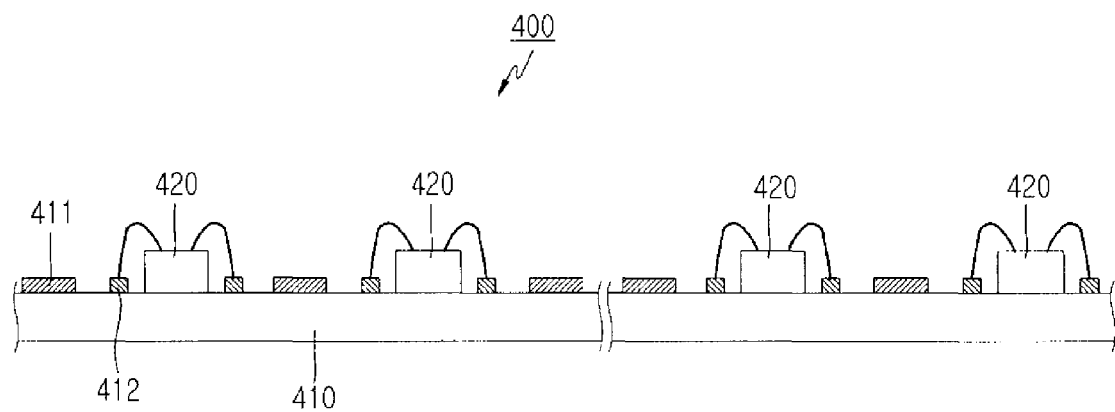
FIGS. 4A to 4E are cross-sectional views showing respective fabricating steps of a semiconductor die package or an integrated circuit package according to a third embodiment of the present invention.

FIG. 4A is a cross-sectional view showing the substrate 410 (or a printed circuit board) on which the circuit patterns including the ground/electrical terminals 411 and 412 are formed and the semiconductor dies 420 are seated. Herein, the ground terminals 411 may extend longer than the electrical terminals 412. If necessary, the length of the ground terminals 411 can be equal to or less than the electrical terminals 412.

Figure 4B:
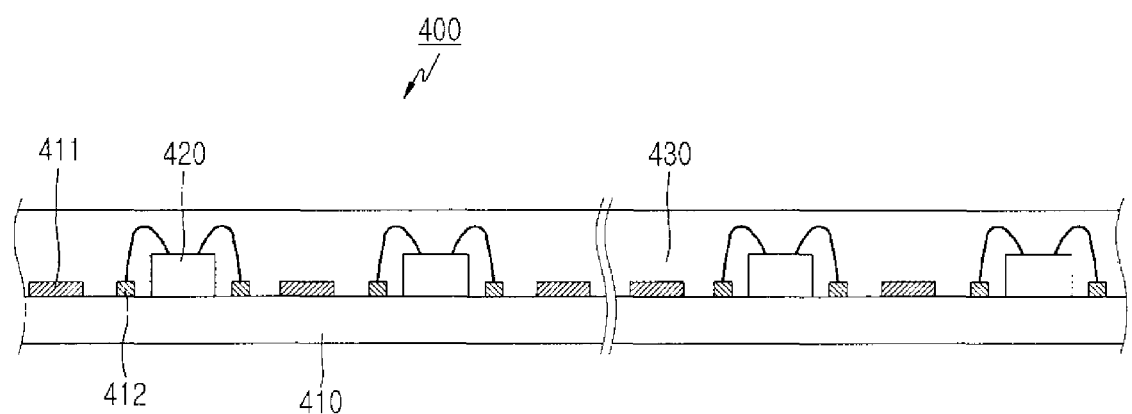

FIG. 4B is a cross-sectional view showing the substrate 410 (shown in FIG. 4A) on which the molding 430 is formed.

Figure 4C:
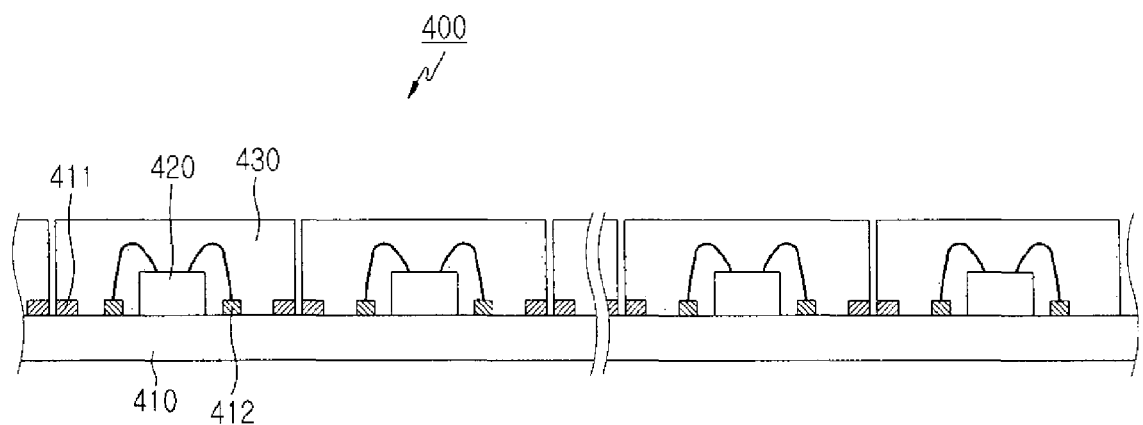

FIG. 4C illustrates a step wherein the molding 430 and the ground terminals 411 are selective cut. In the present embodiment, the ground terminals 411 are formed to be exposed to the outer surface of the molding 430.

Figure 4D:
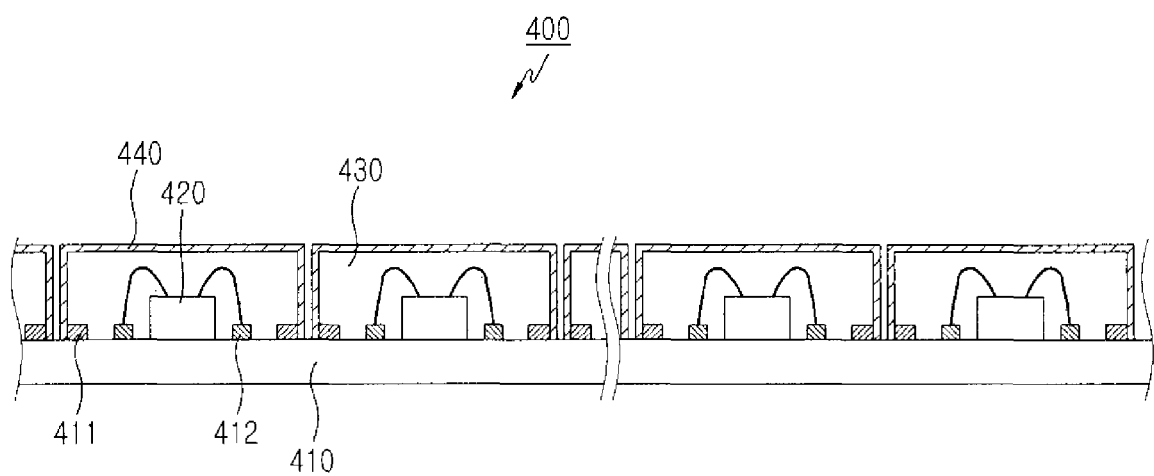

FIG. 4D is a cross-sectional view showing the conductive layer 440 laminated on the outer surface of the molding after the molding 430 and the ground terminals 411 are cut, as shown in FIG. 4C. Referring to FIG. 4D, the ground terminals 411 of the semiconductor die package or the integrated circuit package according to the present embodiment are exposed to the outer surface of the molding 430, and thus can be electrically connected to the conductive layer 440. The conductive layer 440 is formed through plating or metallic coating, while a protective film (not shown) is attached to the lower surface of the substrate 410. After the formation of the conductive layer 440, the protective film may be removed.

The molding 430 is cut by sawing, or other similar processes, e.g., etching in such a manner the ground terminals 411 are exposed to the outside. Then, the ground terminals 411 can be activated by a laser direct structure. The conductive layer 440 may be laminated on the surface of the molding 430 so as to be electrically connected to the ground terminals 411 through electroless plating.

Figure 4E:
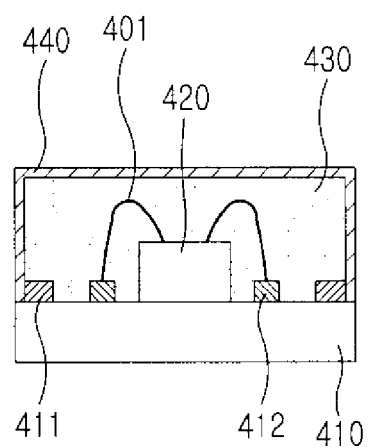

FIG. 4E is a cross-sectional view showing one semiconductor die package (or integrated circuit package) completely separated from the substrate 410 (or a printed circuit board) shown in FIG. 4D, through cutting along the cutting sections on the molding 430.

Each of the ground terminals 411 according to the present embodiment may have a structure where the ground terminals are not connected through electrical wirings but extend to have an increased length. Herein, the ground terminals 411, together with the molding 430, are cut, and thus the side surfaces of the ground terminals 411 are exposed to the outer surface of the molding 430.

The present invention provides a semiconductor die package (or an integrated circuit package) provided with a means of shielding electromagnetic wave with small volume, in which a conductive layer laminated by plating is formed on a molding surface.

In the present invention, although a metal can is not partially soldered to a substrate, it is possible to form a conductive layer not spaced apart from the substrate. Moreover, since the conductive layer is formed through plating or coating, it is possible to mass-produce a semiconductor die package (or an integrated circuit package) provided with an electromagnetic wave shielding means.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method for fabricating a semiconductor die package, the method comprising:
    forming circuit patterns including ground and electrical terminals on a substrate;
    mounting multiple semiconductor dies on the substrate;
    electrically connecting adjacent ground terminals by electrical wirings;
    forming a molding covering the circuit patterns and the semiconductor dies on the substrate;
    cutting the electrical wirings for connecting adjacent ground terminals and the molding to form spacing between the connected adjacent ground terminals and to expose the substrate to the spacing; and
    laminating a conductive layer onto an outer surface of the molding.

2. The method as claimed in claim 1, wherein the molding is cut wherein the electrical wirings connected to adjacent ones of the ground terminals are exposed to side surfaces of the molding.

3. The method as claimed in claim 1, wherein the conductive layer is laminated wherein the conductive layer is electrically connected to the electrical wirings exposed to the outer surface of the molding.

4. A method for fabricating a semiconductor die package, the method comprising:
    forming circuit patterns including ground and electrical terminals on a substrate;
    mounting multiple semiconductor dies on the substrate;
    forming a molding covering the circuit patterns and the semiconductor dies on the substrate;
    cutting the ground terminals and the molding to form spacing between the connected adjacent ground terminals and to expose the substrate to the spacing; and
    laminating a conductive layer on an outer surface of the molding.

5. A method for fabricating an integrated circuit package, the method comprising:
    forming circuit patterns including ground and electrical terminals on a printed circuit board;
    mounting multiple semiconductor die packages on the printed circuit board;
    electrically connecting adjacent ground terminals from the circuit patterns by electrical wirings;
    forming a molding covering the circuit patterns and the semiconductor die packages on the printed circuit board;
    etching the molding and selected electrical wirings between the ground terminals and the molding; and
    laminating a conductive layer on an outer surface of the molding, said conductive layer in electrical contact with said exposed electrical wiring ends.

6. A semiconductor die package comprising:
    a substrate;
    a plurality of semiconductor dies formed on the substrate, wherein each of the semiconductor dies is electrically connected to at least one electrical terminal formed on the substrate;
    a plurality of ground terminals formed on the substrate, wherein adjacent ground terminals are spaced by etching region from each other;

a molding covering the plurality of semiconductor dies, the electrical terminals and the ground terminals while exposing sides of the adjacent ground terminals facing the etching region that forms spacing between the connected adjacent ground terminals and exposes the substrate to the spacing; and
a conductive layer laminated on the molding and the exposed sides of the adjacent ground terminals.

7. The semiconductor die package as claimed in claim 6, wherein the conductive layer is laminated on an outer surface of the molding.

8. The semiconductor die package as claimed in claim 7, wherein said exposed wire ends are in electrical contact with said conductive layer.

* * * * *